United States Patent [19]

McCann

[11] 4,138,737
[45] Feb. 6, 1979

[54] NON-VOLATILE MEMORY WITH IMPROVED READOUT

[75] Inventor: David H. McCann, Ellicott City, Md.

[73] Assignee: Westinghouse Electric Corp., Pittsburgh, Pa.

[21] Appl. No.: 884,530

[22] Filed: Mar. 8, 1978

[51] Int. Cl.² ............................................. G11C 21/00
[52] U.S. Cl. .................................. 365/78; 307/221 R
[58] Field of Search ............... 307/238, 221 R, 221 C, 307/221 D; 365/78, 222

[56] References Cited

U.S. PATENT DOCUMENTS 4,065,756  12/1977  Panigrahi ............................. 365/78

Primary Examiner—Terrell W. Fears
Attorney, Agent, or Firm—R. M. Trepp

[57] ABSTRACT

An improved electrically alterable non-volatile memory for storing information is described incorporating an array of memory cells comprised of variable threshold field effect transistors, means for selecting a row in the array, means for writing information into the memory cells of a selected row, and means for reading information from the memory cells of a selected row by comparing the voltage difference of successive memory cells in the selected row.

7 Claims, 3 Drawing Figures

NON-VOLATILE MEMORY WITH IMPROVED READOUT

BACKGROUND OF THE INVENTION

1. Field of the Invention

This invention relates to semiconductor memories, particularly to non-volatile memories using variable threshold transistors.

2. Description of the Prior Art

Non-volatile variable threshold transistors such as metal nitride oxide semiconductor (MNOS) transistors store information by holding charge in the gate dielectric of the transistor. The presence or absence of charge in the gate dielectric of the transistor results in a change in the threshold voltage of the transistor. For example, in MNOS memory arrays, an electrical bias across the gate and body of a selected transistor will cause electron tunneling through a thin oxide layer to the nitride oxide interface. The charge stored on the nitride oxide interface decays with time and with the number of read-write cycles the device has endured. In addition, the non-uniformity of variable threshold transistor device characteristics from transistor to transistor as a result of processing an array of memory transistors make information retrieval by detection of the absolute threshold voltage of a variable threshold transistor a problem.

One memory array arrangement to enhance information retrieval has been to use two variable threshold transistors per memory cell where one device is written as the complement of the other. A wide spread in the threshold voltage, $V_T$, of the two transistors in the memory cell enable detection of the memory cell by comparison of the two threshold voltages. The two variable threshold transistors of the memory cell will have experienced the same processing and read-write history which may not effect the difference in threshold voltages between the two transistors. This technique, however, requires two transistors per memory cell.

It is therefore desirable to provide the detection of a memory cell comprising a single memory transistor by comparing its threshold voltage with the threshold voltage of another memory transistor comprising a memory cell having a known or detected memory state.

It is therefore desirable to provide a means to detect the memory state of a memory cell utilizing one transistor by detecting changes in the threshold voltage between adjacent memory transistors in a memory array.

It is therefore desirable to provide a technique for detecting the memory state of a memory cell utilizing one transistor by sequentially comparing the threshold voltage of a memory transistor with an adjacent memory transistor. Although there may be significant and undetermined differences and characteristics from memory transistor to transistor across a memory array, adjacent memory transistor differences will be small when adjacent memory transistors are in the same memory or logic state and will be large when they are in opposite or complement memory or logic states.

SUMMARY OF THE INVENTION

In accordance with the present invention, an electrically alterable non-volatile memory is provided for storing information comprising an array of electrically alterable non-volatile memory elements arranged in at least a row and a plurality of columns, means for selecting a row of the array, means for writing information into a first, second and third bit of the selected row, and means for reading information from the first, second and third bits of the selected row including means for comparing the threshold voltage of the first bit with the second bit and of the second bit with the third bit.

DESCRIPTION OF THE PREFERRED EMBODIMENTS

Figure 1:
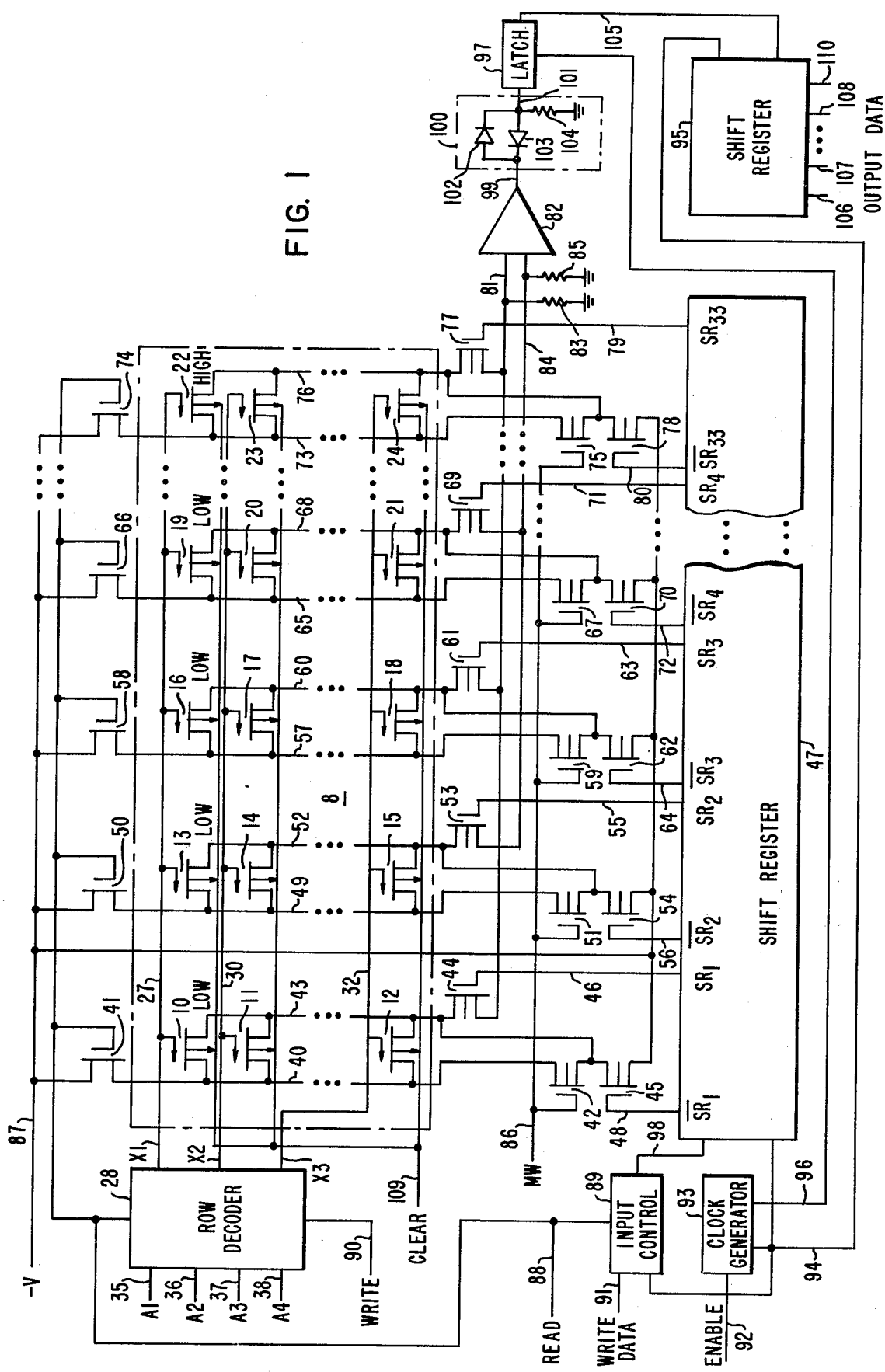
FIG. 1 is a circuit schematic of one embodiment of the invention.

Referring to FIG. 1, a circuit schematic of one embodiment of the invention is shown. Memory array 8 comprises a plurality of electrically alterable non-volatile memory elements arranged in a plurality of rows and columns. A memory element may for example be a variable threshold transistor such as metal nitride oxide semiconductor (MNOS) transistor. As shown in FIG. 1, the memory elements of memory array 8 are P-channel enhancement mode variable threshold transistors 10 through 24. Each variable threshold transistor 10 through 24 has a gate, source and drain electrode and body which may be the substitute. The body of the variable threshold transistors comprising memory array 8 may be in a common substrate tub isolated from other silicon areas containing fixed threshold transistors to permit clearing the variable threshold transistors with a −25 volts bias to the body. Transistors 10 through 12 form a first column in memory array 8. Transistors 13 through 15 form a second column in memory array 8. Transistors 16 through 18 form a third column in memory array 8. Transistors 19 through 21 form a fourth column in memory array 8 and transistors 22 through 24 form a thirty-third column in memory array 8. As shown in FIG. 1, it is understood that additional columns of variable threshold transistors (not shown) are between column 4 and column 33. In memory array 8, the source electrodes of the variable transistors in a column are coupled together and the drain electrodes of the variable transistors in a column are coupled together.

In memory array 8, transistors 10, 13, 16, 19 and 22 form a first row. Transistors 11, 14, 17, 20 and 23 form a second row. Transistors 12, 15, 18, 21 and 24 form a third row. It is understood that additional rows of variable threshold transistors may be inserted in memory array 8 between rows 2 and 3. The gate electrode of the variable threshold transistors in a row are coupled together. As shown in FIG. 1, the gate electrode of the transistors in row 1 are coupled over line 27 to an output of row decoder 28. The gate electrode of the variable threshold transistors in row 2 are coupled over line 30 to an output of row decoder 28. The gate electrodes of the variable threshold transistors in row 3 are coupled over line 32 to an output of row decoder 28. Address signals A1, A2, A3 and A4 are coupled to row decoder 28 over lines 35 through 38, respectively. Row decoder 28 functions to provide a means for selecting one of the rows of memory array 8 in response to the address signals. Memory array 8 functions to store information such as binary information, logic 1's or 0's which may be detected by reading the memory array.

The drain electrode of transistors 10, 11 and 12 are coupled over line 40 to the source electrode of transistor 41 and the drain electrode of transistor 42. The source electrode of transistors 10, 11 and 12 are coupled over line 43 to the drain electrode of transistor 44 and the source electrode of transistors 42 and 45. The gate electrode of transistor 44 is coupled over line 46 to an output of shift register 47 such as bit 1. The gate electrode of transistor 45 is coupled over line 48 to an output of shift register 47 such as the complement output of bit 1. The drain electrode of transistors 13, 14 and 15 are coupled over line 49 to the source electrode of transistor 50 and the drain electrode of transistor 51. The source electrode of transistors 13, 14, and 15 are coupled over line 52 to the drain electrode of transistor 53 and the source electrode of transistors 51 and 54. The gate electrode of transistor 53 is coupled over line 55 to an output of shift register 47 such as bit 2. The gate of transistor 54 is coupled over line 56 to an output of shift register 47 such as the complement output of bit 2. The drain electrode of transistors 16, 17 and 18 are coupled over line 57 to the source electrode of transistor 58 and the drain electrode of transistor 59. The source electrode of transistors 16, 17, and 18 are coupled over line 60 to the drain electrode of transistor 61 and the source electrode of transistors 59 and 62. The gate electrode of transistor 61 is coupled over line 63 to an output of shift register 47 such as bit 3. The gate of transistor 62 is coupled over line 64 to an output of shift register 47 such as the complement output of bit 3.

The drain electrode of transistors 19, 20 and 21 are coupled over line 65 to the source electrode of transistor 66 and the drain electrode of transistor 67. The source electrode of transistors 19, 20 and 21 are coupled over line 68 to the drain electrode of transistor 69 and the source electrode of transistors 67 and 70. The gate electrode of transistor 69 is coupled over line 71 to an output of shift register 47 such as bit 4. The gate electrode of transistor 70 is coupled over line 72 to an output of shift register 47 such as the complement output of bit 4. The drain electrode of transistors 22, 23 and 24 are coupled over line 73 to the source electrode of transistor 74 and the drain electrode of transistor 75. The source electrode of transistors 22, 23 and 24 are coupled over line 76 to the drain electrode of transistor 77 and the source electrode of transistors 75 and 78. The gate electrode of transistor 77 is coupled over line 79 to an output of shift register 47 such as bit 33. The gate of transistor 78 is coupled over line 80 to an output of shift register 47 such as the complement output of bit 33.

The source electrode of transistors 44, 61 and 77 are coupled over line 81 to an input of differential amplifier 82 and to one side of resistor 83. The other side of resistor 83 is coupled to a voltage potential such as ground. The source electrode of transistors 53 and 69 are coupled over line 84 to an input of differential amplifier 82 and to one side of resistor 85. The other side of resistor 85 is coupled to a voltage potential such as ground. The value of resistors 83 and 85 may be for example 5K ohms. The gate electrode of transistors 42, 51, 59, 67 and 75 are coupled over line 86 to control signal MW which is a memory write control signal. The drain of transistors 45, 54, 62, 70 and 78 are coupled over line 87 to a voltage potential, −V, which may be, for example, −25 volts. The drain of transistors 41, 50, 58, 66 and 74 are also coupled over line 87 to the voltage potential −V which may, for example, be −25 volts. The gate of transistors 41, 50, 58, 66 and 74 are coupled over line 88 to an input of row decoder 28, input control 89 and to control signal read.

The write control signal is coupled over line 90 to an input of row decoder 28. Signal write data which provides data to be written into memory array 8 is coupled over line 91 to an input of input control 89. Signal enable is coupled over line 92 to an input of clock generator 93. An output of clock generator 93 is coupled over line 94 to an input of input control 89, to an input of shift register 47 and to an input of shift register 95. A second output of clock generator 93 is coupled over line 96 to an input of latch 97. An output of input control 89 is coupled over line 98 to a data input of shift register 47. The output of differential amplifier 82 is coupled over line 99 to threshold element 100 having an output coupled over line 101 to an input of latch 97. Threshold element 100 may be for example a pair of anti-parallel diodes 102 and 103 coupled in parallel and connected between lines 99 and 101 and includes a resistor 104 coupled between line 101 and a voltage potential such as ground. The output of latch 97 is coupled over line 105 to a data input of shift register 95. The output of shift register 95 may present data in parallel on a number of lines such as lines 106 through 108 and 110. Additional output lines may be provided for each bit such as 32 lines if a 32 bit word is to be read out of shift register 95. Signal clear is coupled over line 109 to the body of transistors 10 through 24 in memory array 8.

Input control 89, clock generator 93, shift register 47, row decoder 28 and transistors 42, 44 and 45 provide a means for writing predetermined information into a first bit of memory array 8. Input control 89, clock generator 93, shift register 47, row decoder 28, and transistors 51, 53 and 54 of column 2 and transistors 59, 61 and 62 of column 3 provide a means for writing information into a second and third bit of a selected row of memory array 8. Transistors 67, 69 and 70 are utilized for writing information into a fourth bit of a selected row of memory array 8. Transistors 75, 77 and 78 are utilized for writing information into a 33rd bit of a selected row of memory array 8. Input control 89, clock generator 93, shift register 47, row decoder 28 along with transistors 41, 42, 44, and 45 provide a means for reading the predetermined information from the first bit of a selected row of memory array 8. Transistors 50, 51, 53 and 54 are utilized for reading information from the second bit of a selected row of memory array 8. Transistors 58, 59, 61 and 62 are utilized for reading information from a third bit of a selected row of memory array 8. Transistors 66, 67, 69 and 70 are utilized for reading information from a fourth bit of a selected row of memory array 8. Transistors 74, 75, 77 and 78 are utilized for reading information from a 33rd bit of a selected row of memory array 8.

Differential amplifier 82 provides a means for comparing the first bit with a second bit of a selected row of memory array 8. Latch 97 provides a first means for storing a predetermined first value when the voltage difference between the first and second bit exceed a predetermined value for storing a predetermined second value when the voltage difference between the first and second bit is less than said predetermined value. Differential amplifier 82 provides a means for comparing said second bit with said third bit. The output of differential amplifier 82 in conjunction with latch 97 provides a second means for changing the value stored in the latch by said first means for storing to said other value when the voltage difference on lines 84 and 84 between the second and third bit exceed the predetermined value. Shift register 95 provides a means for recording the changes of the output signal from latch 97 which is indicative of the data stored in bits 1 through 33.

As shown in FIG. 1, the fixed threshold transistors and the variable threshold transistors are P-type enhancement mode. The source and drain electrodes of the fixed and variable threshold transistors are interchangeable and can work either way. The most positive electrode is normally designated the source electrode. N-type transistors may likewise be used for the fixed and variable threshold transistors provided suitable voltage levels are provided for operation of the N-type transistors.

Figure 2A:
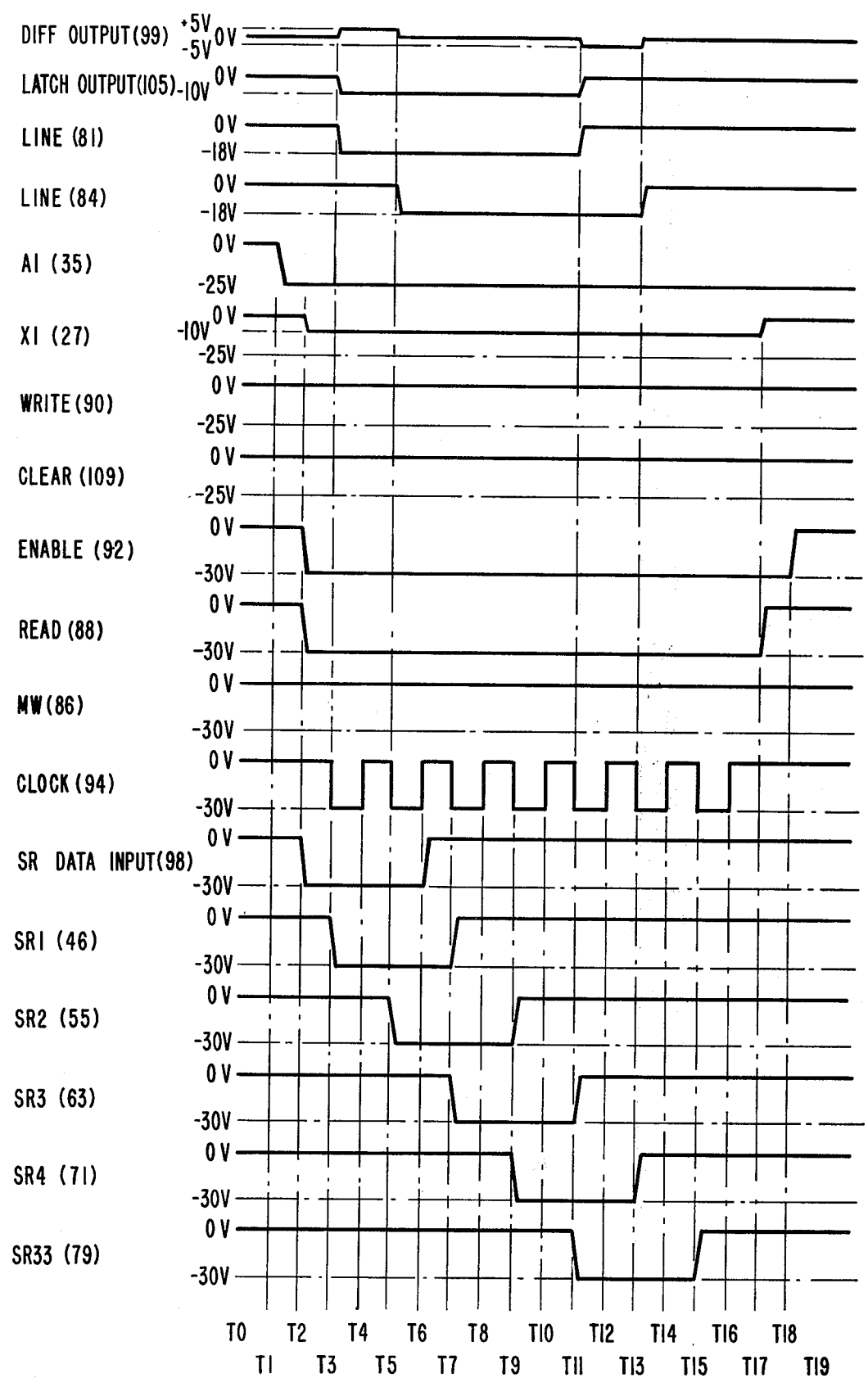
FIGS. 2A and 2B show circuit waveforms for the operation of the embodiment of the invention shown in FIG. 1.
Figure 2B:
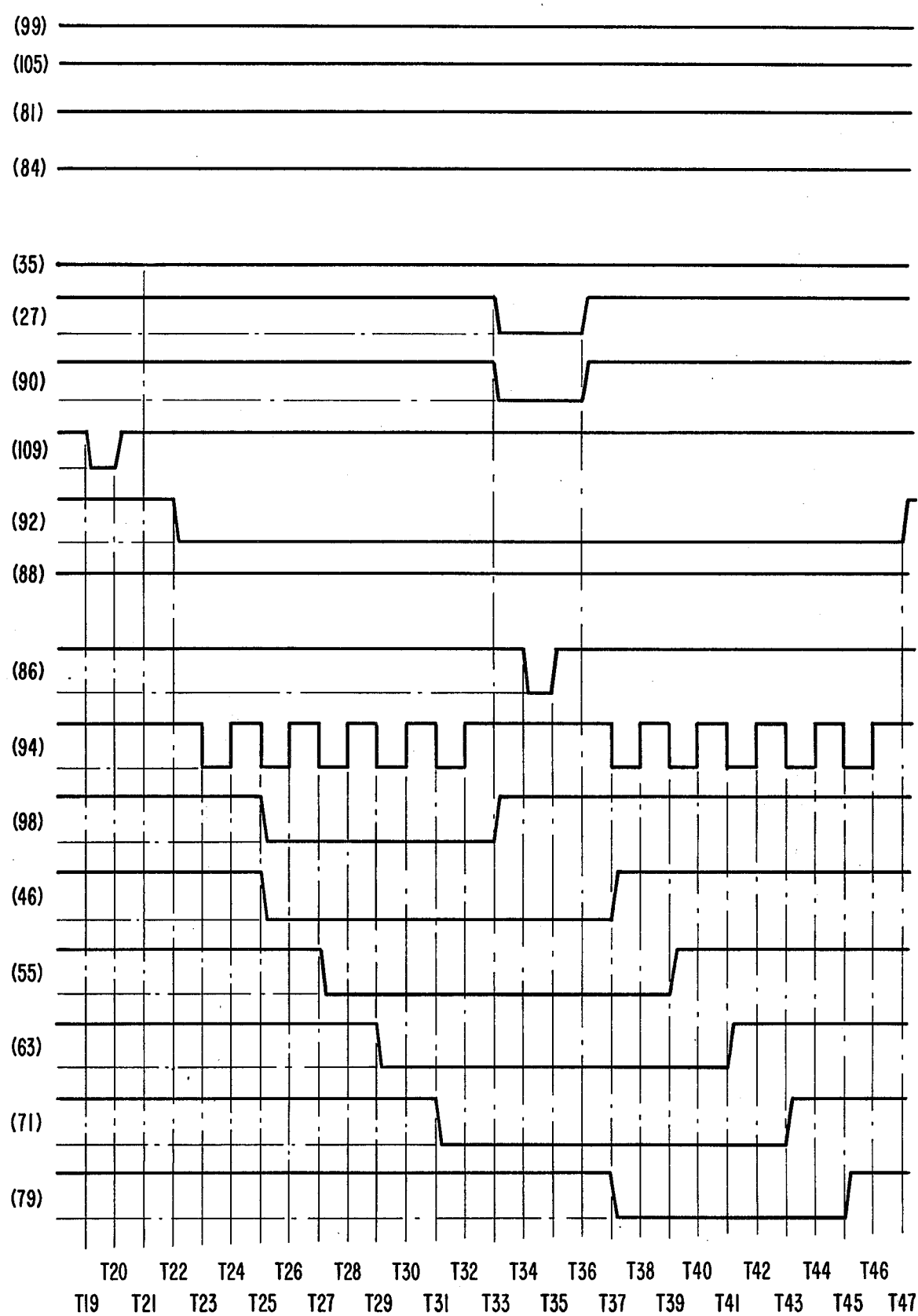

FIGS. 2A and 2B show circuit waveforms for the operation of the embodiment of the invention shown in FIG. 1. In FIGS. 2A and 2B, the ordinant represents voltage and the abscissa represents time. At time T0, signal read on line 88 is at 0 volts. Transistors 41, 50, 58, 66 and 74 are turned off or in the non-conducting state. The outputs or row decoder 28 on lines 27, 30 and 32 are at 0 volts. Signal MW on line 86, signal enable on line 92, signal clock on line 94, signal write on line 90 and signal clear on line 109 are at 0 volts. Shift register data input on line 98 and shift register outputs on line 46, 55, 63, 71 and 79 are 0 volts. The complement outputs of shift register 47 on lines 48, 56, 64, 72 and 80 are at −30 volts.

At time T1, the address signals A1 through A4 on lines 35 through 38 are presented to row decoder 28 to select a particular row in memory array 8. At time T2, signal enable on line 92 goes from 0 volts to −30 volts which enables clock generator 93 to reset latch 97 by means of a signal on line 96 and to provide a clock pulse on line 94 at time T3. At time T2, signal read on line 88 also goes from 0 to −30 volts causing row decoder to decode in response to the signals on the address lines A1 through A4 to select a particular row. As shown in FIG. 2A, signal X1 on line 27 for example, is the selected row and goes from 0 to −10 volts. The other row lines such as lines 30 and 32 remain at 0 volts. In response to the read signal, input control 89 causes signal shift register data input 98 to go from 0 At time T2 signal read on line 88 causes transistors 41, 50, 58, 66 and 74 to go from the non-conducting state to the conducting state placing the voltage potential of −V on line 87 minus one threshold voltage drop $V_T$, such as from transistor 41 to be on line 40 such as −22 volts. Lines 49, 57, 65 and 73 will likewise be pulled to a potential of about −22 volts.

The variable threshold transistors in memory array 8 may be written to a low threshold voltage state such as −2 volts or to a high threshold voltage state such as −10 volts. At time T2, variable threshold transistor 10 may or may not be conducting depending upon the threshold voltage, $V_T$. If, for example, the threshold voltage of variable threshold transistor 10 low, high, that is $V_T = -2$ volts, then variable threshold transistor 10 will be conducting. Transistor 45 will be conducting due to the voltage on line 48 causing line 43 to be pulled low to −22 volts which takes into account a threshold voltage drop from transistor 45. During read operation, transistors 42, 51, 59, 67 and 75 will be non-conducting. At time T2, transistors 44, 53, 61, 69 and 77 will be non-conducting since the voltage on their gate electrode is at 0 volts. If a variable threshold transistor 10 has a threshold voltage at −2 volts, for example, transistor 10 will be conducting providing a second path through the drain electrode for discharging the source.

For example, variable threshold transistors 13, 16 and 19 may be written into the low threshold state having a threshold voltage, $V_T$, of −2 volts. Variable threshold transistor 22 may, for example, have a threshold voltage, $V_T$, of −10 volts which is the high threshold voltage state. Lines 52, 60 and 68 would therefore be at −22 volts having a discharge path through transistors 54, 62 and 70 to line 87, respectively. A second path is provided by transistors 13 and 50, 16 and 58, and 19 and 66, respectively to line 87. Variable threshold transistor 22 would be in the non-conducting state. With line 76 at −22 volts caused by the discharge path through transistor 78 to line 87.

At time T3, the output of clock generator 93 on line 94 the clock signal goes from 0 volts to −30 volts which causes the signal data input on line 98 to be shifted into the shift register 47 and appear at the output of the first bit at SR1 on line 46 which goes from 0 to −30 volts. The complement signal on line 48 goes from −30 volts to 0. The other outputs of shift register 47 such as lines 55, 63, 71 and 79 remain at 0 volts.

At time T3 when bit 1 of shift register 47 on line 46 goes from 0 to −30 volts, transistor 44 goes into the conducting state and couples line 43 to line 81 which is coupled to an input of diferential amplifier 82. Line 48 goes from −30 volts to 0 volts causing transistor 45 to be non-conducting. Variable threshold transistor 10 and transistor 41 will continue to conduct current to line 87 holding line 43 at the potential of −V minus the voltage threshold drops of transistors 10 and 41. If the voltage of line 87 is −25 volts, then the voltage of line 43 will be approximately −21 volts. The voltage on line 81 at the input of differential amplifier 82 is dependent upon the voltage dividing the impedance of resistor 83 to the impedance or threshold voltage drop of transistors 44, 10 and 41. The value of resistor 83 may be adjusted so that when transistors 41, 10 and 44 are conducting, the voltage on line 81 may be pulled low to −18 volts or thereabouts. Transistors 61 and 77 do not effect the voltage on line 81 since they are nonconducting. The voltage on line 84 is pulled through resistor 85 to ground potential since transistors 53 and 69 are non-conducting. With the voltage on line 84 at 0 volts and the voltage on line 81 at −18 volts, the output of differential amplifier 82 goes from 0 to +5 volts. The signal on line 99 passes through threshold element 100 to latch 97 which causes the output of latch 97 on line 105 to go from 0 volts to −10 volts.

At time T4, clock 94 goes from −30 volts to 0 volts to complete one clock pulse. At time T5, signal clock on line 94 goes from 0 volts to −30 volts causing shift register 47 to shift its data one bit and at the same time enter the data at shift register data input 98 to the first bit on line 46. Line 46 therefore remains at −30 volts and line 55 goes from 0 volts to −30 volts representing the output of the second bit. At time T5, both transistors 44 and 53 are conducting and transistors 45 and 54 are non-conducting. Transistors 61, 69 and 77 are non-conducting. The voltage on line 81 remains the same as at time T3 at −18 volts while the voltage on line 84 goes from 0 volts to −18 volts. Line 84 goes low because variable threshold transistor 13 is in the low threshold state having a threshold voltage of −2 volts causing it to be conducting. The voltage on lines 81 and 84 represent a comparison of the conductivities of variable threshold transistors 10 and 13. By knowing the threshold voltage, $V_T$ state of variable threshold transistor 10, the threshold voltage state, high or low, of variable threshold transistor 13 can be determined by comparing the conductivities or threshold voltages of the two transistors. With the input voltages on lines 81 and 84 to differential amplifier 82 both being at or about −18 volts, the outpt of differential amplifier 82 is very close to 0 volts. Threshold element 100 functions to provide a threshold voltage (plus and minus) from which an output of differential amplifier 82 must exceed before the signal will pass to the input on line 101 of latch 97. With the voltage on line 99 close to 0, the voltage on line 101 will be 0 with latch 97 remaining unchanged. Line 105, the output of latch 97 will therefore remain at −10 volts.

At time T6, the voltage on line 94 goes from −30 volts to 0 volts which completes the second clock pulse. Input control 89 causes its output, shift data register input on line 98, to go from −30 volts to 0 volts. At time T7, the clock begins its third pulse by the voltage on line 94 going from 0 volts to −30 volts. The first bit of shift register 47, line 46 goes from −30 volts to 0 volts since a 0 volt data signal was shifted into the shift register 47. Bit 2 on line 55 remains at −30 volts and bit 3 on line 63 of shift register 47 goes from 0 volts to −30 volts. Transistors 44, 69 and 77 are therefore non-conducting and transistors 53 and 61 are conducting. Since variable threshold transistors 13 and 16 are both in the low threshold voltage state, $V_T$, of −2 volts, both variable threshold transistors 13 and 16 are conducting causing lines 52 and 60 to be low at about −21 volts pulling lines 81 and 84 low to approximately −18 volts. The voltage on lines 81 and 84 are a comparison of the threshold voltages of variable threshold transistors 13 and 16. By comparing the voltage on line 81 to the voltage on line 84, a comparison is made of the threshold voltage of variable threshold transistors 16 to variable transistor 13. The output of differential amplifier 82 is 0 or close to 0 and the output of latch 97, line 105, remains unchanged. At time T8, the voltage on line 94 goes from −30 to 0 completing the third clock pulse.

At time T9, the voltage on line 94 goes from 0 volts to −30 volts which is the beginning of the fourth clock pulse. At T9, the voltage on line 55, the output of bit 2 goes from −30 volts to 0 volts. Bit 3, line 63, remains at −30 volts. Bit 4, the voltage on line 71, goes from 0 volts to −30 volts. Transistors 61 and 69 are conducting while the transistors 44, 53 and 77 are non-conducting. Transistors 62 and 70 are non-conducting while transistors 45, 54 and 78 are conducting. Variable threshold transistors 16 and 19 are in the low threshold voltage state and are therefore conducting. The voltage on lines 81 and 84 are again pulled to approximately −18 volts due to the conduction of variable threshold transistors 16 and 19. The output of differential amplifier 82 is close to 0 volts and the output of latch 97, line 105, remains unchanged. At time T10, the voltage on line 94 goes from −30 volts to 0 volts which competes the fourth clock pulse.

At time T11, the voltage on line 94 goes from 0 volts to −30 volts which is the beginning of the fifth clock pulse. The shift register shifts its data one bit which causes the output of bit 3 to go from −30 volts to 0 volts on line 63. The voltage on line 71, bit 4, remains at −30 volts and the output of bit 33 or line 79 goes from 0 volts to −30 volts. Transistors 69 and 77 are therefore conducting while transistors 44, 53 and 61 are non-conducting. Transistors 70 and 78 are non-conducting while transistors 45, 54 and 62 are conducting. Variable threshold transistor 19 is in the low threshold voltage state while variable threshold transistor 22 is in the high threshold voltage state which results in transistor 19 conducting and transistor 22 non-conducting. The voltage on line 84 remains at −18 volts while the voltage on line 81 goes from −18 volts to 0 volts. The output of differential amplifier 82 on line 99 goes from 0 volts to −5 volts. The voltage on line 99 exceeds the threshold voltage of threshold element 100 and passes to line 101 which goes from 0 volts to −5 volts causing latch 97 to go from −10 volts which appears on line 105. At T12, the voltage on line 94 goes from −30 volts to 0 volts completing the fifth clock pulse.

Between the times T3 through T12, variable threshold transistors 13, 16, 19 and 22 have been read out or detected by comparing in sequential manner a transistor having a known threshold voltage state with a transistor having an unknown threshold voltage state. The threshold voltage state of variable threshold transistor 10 was predetermined to enable a basis for determining the threshold voltage of variable threshold transistor 13. The output of latch 97 on line 105 therefore provides the information stored in variable threshold transistors 13, 16, 19 and 22 detected by comparing the threshold voltage state of another variable threshold transistor with itself.

It is understood that the first variable threshold transistor to be read may have its threshold voltage detected by comparing it with a voltage potential such as ground at differential amplifier 82. Thereafter, subsequent detection may be made by comparing the memory transistor's threshold state with another memory transistor. If, for some reason, the first detection was incorrect, then the information would still be read out, but in complement of the true data.

The output of latch 97 may be conveniently stored in shift register 95 utilizing the clock on line 94 and the voltage on line 105 as the input data. Shift register 95 merely converts the serial data on line 105 to parallel data available on lines 107 through 109 and 110.

At time T13, the voltage on line 94 goes from 0 to −30 volts causing shift register 47 to shift another bit causing the output of bit 4 or line 71 to go from −30 volts to 0 volts while the output of bit 33, line 79 remains at −30 volts. At time T14, the voltage on line 94 goes from −30 volts to 0 volts completing the sixth clock pulse. At time T15, the voltage on line 94 goes from 0 volts to −30 volts causing the shift register to shift the data another bit in the register causing bit 33, line 79 to go from −30 volts to 0 volts. At time T16, the voltage on line 94 goes from −30 volts completing the seventh clock pulse. At time T17, signal read on line 88 goes from −30 volts to 0 volts causing transistors 41, 50, 58, 66 and 74 to be non-conducting. Row decoder 28 brings the selected row line, line 27, from −10 volts to 0 volts. At time T18, signal enable on line 92 goes from −30 volts to 0 volts which completes one read operation of the memory transistors in a selected row of memory array 8 and resets the clock generator 93.

One method of writing information into memory array 8 will now be described. At T19, signal clear on line 109 goes from 0 volts to −25 volts pulling the body of the variable threshold transistors in memory array 8 to −25 volts. With 0 volts on all the row select lines from row decoder 28, the gate electrode of each variable threshold transistor in memory array 8 will be at 0 volts. With a polarizing voltage across the dielectric between the gate and body of each variable threshold transistor of +25 volts, the threshold voltage, $V_T$, of each variable threshold transistor in memory array 8 will be shifted to the low threshold voltage state such as −2 volts. At time T20, the clear signal on line 109 will go from −25 volts to 0 volts. At time T21, the address signals A1 through A4 are provided to row decoder 28 to select a row in memory array 8 which will be written into. At time T22, the voltage on line 92 signal enable goes from 0 volts to −30 volts which starts clock generator 93. From T23 through T32, the voltage on line 94 is pulsed from 0 to −30 volts five times to provide five clock pulses for shifting data into shift register 47 representative of the write data on line 91 which may, for example, be low, low, low, low, and high. At time T33, signal write on line 90 goes from 0 volts to −30 volts causing row decoder 28 to decode the address signals on lines 35 to 38 to select a particular row in memory array 8. The selected row such as row 1 on line 27 would have its voltage go from 0 volts to −25 volts. As shown in FIG. 2B, after the data (low, low, low, low and high) is shifted into shift register 47, the voltage on lines 46, 55, 63 and 71 are at −30 volts and the voltage on line 79 is at 0 volts. Transistors 44, 53, 61 and 69 would therefore be conducting coupling the source of the variable threshold transistor to ground through resistors 83 and 85. Transistor 78 will be conducting which will couple line 76 to line 87 which is at the voltage potential of −V or −25 volts, for example. At time T34, signal MW for memory write on line 86 goes from 0 volts to −30 volts causing transistors 42, 51, 59, 67 and 75 to be conducting and coupling the source electrode to the drain electrode of the memory transistors in each column. Since line 27 is at −25 volts and line 43 and 40 are at 0 volts, a channel in the body substrate will form underneath the gate electrode and extended between the source and drain electrode of variable threshold transistor 10 shifting variable threshold transistor 10 to a high threshold state with a gate to drain, source, and body electrode voltage of −25 volts. The −25 volt polarizing voltage occurs between the gate and channel of transistors 13, 16 and 19 causing these transistors to shift the threshold voltage to the high threshold voltage state of −10 volts. Variable threshold transistor 22, however, will have a negative voltage on line 76 and 73 since transistors 75 and 78 are conducting causing a 0 or insufficient polarization voltage across the dielectric underneath the gate electrode. At time T35, signal MW on line 86 goes from −30 volts to 0 volts and at time T36, signal write on line 90 goes from −25 volts to 0 volts causing row decoder 28 to bring the voltage on line 27 from −25 volts to 0 volts. At time T37, the voltage on line 94 may pulse a sufficient number of times to clear shift register 47 to having all outputs at 0 volts. At time T47, signal enable on line 92 goes from −30 volts to 0 volts which completes the write operation for writing data into a selected row of memory array 8.

An electrically alterable non-volatile memory for storing information is described utilizing an array of electrically alterable non-volatile memory elements arranged in at least a row and a plurality of columns, means for selecting a row in the array, means for writing information into a first, second and third bit of a selected row, and means for reading information from the first, second and third bits of the selected row including means for comparing the threshold voltage of the first bit with the second bit and of the second bit with the third bit.

I claim:

1. An electrically alterable non-volatile memory for storing information comprising:
   an array of electrically alterable non-volatile memory elements arranged in at least a row and a plurality of columns,
   means for selecting a row in said array,
   means for writing information into a first, second and third bit of said selected row, and
   means for reading information from said first, second and third bits of said selected row including means for comparing the threshold voltage of said first bit with said second bit and of said second bit with said third bit.

2. The memory of claim 1 wherein said means for writing information includes:
   a shift register,
   means for entering write data in the said shift register, and
   means for coupling a predetermined voltage across said memory element comprising said first, second and third bit of said selected row in response to said write data in said shift register.

3. The memory of claim 2 wherein said memory elements include metal nitride oxide semiconductor (MNOS) transistors, each having a gate, source and drain electrode.

4. The memory of claim 3 wherein said means for coupling a predetermined voltage includes:
   means for coupling the source and drain electrode of said transistors comprising said first, second and third bit together,
   means for coupling the source electrode of some of said transistors comprising said first, second and third bit to a first voltage in response to said write data in said shift register,
   means for coupling the source electrode of some other of said transistors comprising said first, second and third bit to a second voltage in response to said write data in said shift register, and wherein
   said means for selecting a row includes means for placing a predetermined voltage on the gate electrodes of the transistors in said selected row in said array.

5. The memory of claim 4 wherein said means for writing information includes means for coupling a predetermined voltage across the gate electrode and body of the transistors in said array to set the threshold voltage of each transistor to a threshold state.

6. The memory of claim 1 wherein said memory elements include:
   metal nitride oxide semiconductor (MNOS) transistors, each having a gate, source and drain electrode,
   said means for reading information includes means for coupling the drain electrode of said transistors comprising said first, second and third bit to a first voltage,
   said means for selecting a row includes means for placing a predetermined voltage on the gate electrodes of the transistors in said selected row in said array, and wherein
   said means for comparing includes a comparator means for coupling the source electrode of said transistor comprising said first bit to a first input of said comparator, and means for coupling the source electrode of said transistor comprising said second bit to a second input of said comparator.

7. An electrically alterable non-volatile memory for storing information comprising:
- an array of electrically alterable non-volatile memory elements arranged in a plurality of rows and columns,
- means for selecting one of said rows in said array in response to address signals,
- means for writing predetermined information into a first bit and for writing information into at least a second and third bit of a selected row,
- means for reading information from at least said second and third bits of selected row including means for comparing said first bit with said second bit, first means for storing a predetermined first value when the voltage difference between said first and second bit exceed a predetermined value and for storing a predetermined second value when the voltage difference between said first and second bit is less than said predetermined value,
- means for comparing said second bit with said third bit, and
- second means for changing said value stored by said first means for storing to said other value when the voltage difference between said second and third bit exceed said predetermined value.